(12) United States Patent
Guidry

(10) Patent No.: US 7,265,694 B2
(45) Date of Patent: Sep. 4, 2007

(54) SYSTEM AND METHOD FOR SUCCESSIVE APPROXIMATION

(75) Inventor: David Walker Guidry, Rowlett, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/808,908

(22) Filed: Mar. 25, 2004

(65) Prior Publication Data
US 2005/0219107 A1    Oct. 6, 2005

(51) Int. Cl.
*H03M 1/10*    (2006.01)
(52) U.S. Cl. ............... 341/120; 341/158; 324/76.15
(58) Field of Classification Search ........... 341/120, 341/165, 123, 110, 156, 158, 163; 324/76.15
See application file for complete search history.

(56) References Cited

U.S. PATENT DOCUMENTS

| | | | |
|---|---|---|---|
| 4,394,743 A * | 7/1983 | Mercer | 702/124 |
| 4,532,495 A * | 7/1985 | Gagnon | 341/110 |
| 4,578,667 A * | 3/1986 | Hollister | 341/122 |
| 4,641,246 A * | 2/1987 | Halbert et al. | 341/163 |
| 4,807,147 A | 2/1989 | Halbert et al. | |
| 5,049,882 A * | 9/1991 | Gorecki et al. | 341/143 |
| 5,057,841 A * | 10/1991 | Veerhoek et al. | 341/156 |
| 5,422,889 A * | 6/1995 | Sevenhans et al. | 370/442 |
| 5,426,431 A * | 6/1995 | Ryu | 341/158 |
| 5,578,935 A | 11/1996 | Burns | |
| 5,589,763 A | 12/1996 | Burns | |
| 5,644,308 A * | 7/1997 | Kerth et al. | 341/120 |
| 5,708,432 A | 1/1998 | Reynolds et al. | |
| 6,195,032 B1 * | 2/2001 | Watson et al. | 341/162 |
| 6,369,744 B1 * | 4/2002 | Chuang | 341/161 |
| 6,515,606 B2 * | 2/2003 | Lyden | 341/143 |
| 6,683,550 B2 * | 1/2004 | Al-Awadhi | 341/143 |

* cited by examiner

*Primary Examiner*—Jean Bruner Jeanglaude
(74) *Attorney, Agent, or Firm*—William B Kempler; W. James Brady, III; Frederick J. Telecky, Jr.

(57) ABSTRACT

A system and method for providing successive approximation, such as can be used by a successive approximation converter or by a coherent undersampling digitizer. The system comprising a memory having a successive approximation value and a comparison system configured to receive and amplify the difference between a test signal and the successive approximation value and to convert the amplified signal to a digital signal. A multi-bit analog to digital convert can be used to convert the amplified signal to a digital signal.

22 Claims, 3 Drawing Sheets

SYSTEM AND METHOD FOR SUCCESSIVE APPROXIMATION

TECHNICAL FIELD

The present invention is generally related to systems and methods for performing successive approximations and testing devices employing successive approximation routines.

BACKGROUND

A typical successive approximation converter has one input, a test input, coupled to a signal to be approximated, and the other input receives a successive approximation value generated by a logic circuit commonly referred to as a successive approximation register (SAR). During each clock cycle, a comparator produces an output used by the successive approximation register to produce the next successive approximation value. Consequently, the successive approximation register performs one bit of conversion per clock cycle. For example, for a successive approximation register having N bits, where N is an integer greater than zero, the N bit successive approximation register requires N clock cycles to perform the conversion.

For example, for a comparator that has the test input connected to the negative input and the successive approximation register connected to the positive input with a reference voltage (Vref), during the first clock period compares the test input to the most significant bit (MSB) of the successive approximation value, e.g., the most significant bit of the successive approximation register is raised high. If the output of the comparator remains high, then the input lies somewhere between 0 and Vref/2, and the MSB is reset to 0. However, if the comparator output is low, then the input signal is somewhere between Vref/2 and Vref, and the MSB is set high. During the next clock period, the MSB-1 bit is evaluated in the same manner. This procedure is repeated such that at the end of N clock periods all N bits have been resolved.

The test input can be sampled by using a sample and hold to freeze the voltage. Alternatively, coherent undersampling digitizers (CUD) have been developed that sample a repeating waveform repeatedly at the same point in its period, but each sample occurs during a different cycle. The coherent undersampling digitizers sample at a rate less than the Nyquist rate, which is possible because of the repetitive nature of the test stimuli. Repetitive sampling allows the sampling theorem to be satisfied without directly sampling a signal at greater than twice the highest frequency component of the signal. The CUD architecture is useful for testing new devices, as frequently the new device being tested operates at a speed that is faster than the testing equipment.

The CUD architectures employs a high-speed comparator, strobed by a divided down version of a clock source to make the successive approximation decisions. The stimulus for the device under test (DUT) is produced by a high-speed signal generator, which is driven by a clock source, which can be different than the clock source used for making successive approximation decisions.

Since the comparator strobe slips to the next sampling point on each rising edge, a modified SAR approach is used. Instead of iterating on the same sampling point N times, the conversion is performed in a shuffled order. The first S strobes (where S is an integer greater than zero indicating the number of sampling points on the repetitive test waveform) will determine the most significant bits, e.g. MSB[0] through MSB[S-1]. The next S strobes will determine MSB-1[0] through MSB-1 [S-1], which continues until LSB[0] through LSB[S-1] are determined. Using this algorithm, all of the sample points are computed simultaneously and the CUD uses a S×N memory to store the results. Alternatively, the CUD can determine each sample point individually by ignoring strobes for sample points between the sample point being determined, e.g., determine MSB[0], skip S-1 strobes, determine MSB-1[0], skip S-1 strobes . . . until LSB[0] is determined, and repeat for each sample point.

Implementations of these and other architectures have worked very well for high-speed low-resolution applications, such as for example capturing a sub-nanosecond rising edge of a square wave. However, attempts at medium speed, high-resolution sampling have proven problematic. Some of the difficulties at higher resolution are due to the inherent hysteresis of the comparator circuitry. For example, when the successive approximation register's digital to analog converter's voltage approaches that of the input signal, the comparator must make a decision based on a small voltage difference. Comparator hysteresis can also introduce non-linearity and corrupt the measurement. The effects of hysteresis thus can limit the effective resolution of the SAR or digitizer to an unacceptable level.

SUMMARY OF THE INVENTION

The present invention is directed to a system and method for providing successive approximation, such as can be used by a successive approximation converter or by a coherent undersampling digitizer. In accordance with an aspect of the present invention, a successive approximation system may comprise a memory having a successive approximation value and a comparison system configured to amplify the difference between a test signal and a signal indicative of the successive approximation value. The comparison system also provides an amplified signal and converts the amplified signal to a digital signal.

For example, the aforementioned system can also have a multi-bit analog to digital converter for converting the amplified signal to the digital signal. The multi-bit analog to digital converter has a predetermined range. The system can further comprise logic for adjusting the successive approximation value based on the digital signal from the multi-bit analog to digital converter until the digital signal is within the range of the multi-bit analog to digital converter. Optionally, the system can also have a clock circuit to produce clock signals, a signal generating circuit to generate and output a repetitive test waveform to a device under test in accordance with the clock signals. The device under test outputs the test signal. A pulse generating circuit is coupled to the clock circuit for producing sampling point signals corresponding to sampling points spaced across the test signal based on the clock signals. The multi-bit analog to digital converter can convert the amplified signal to a digital signal corresponding to the sampling point signals, which can be used to generate a digitized waveform corresponding to the test signal.

Another aspect of the present invention is directed to a coherent undersampling digitizer. The digitizer comprises means for receiving a repetitive test signal from a device under test in accordance with first clock signals and means for producing a difference signal based on the difference between the repetitive test signal and a successive approximation signal. The digitizer further comprises means for amplifying the difference signal and means for converting the amplified difference signal producing a multi-bit digital comparison signal.

Another aspect of the present invention is for a method for successive approximation. The method comprises combining a test signal with a successive approximation signal, converting the amplified signal to a multi-bit digital comparison signal, and adjusting the successive approximation signal based on the digital comparison signal.

BRIEF DESCRIPTION OF THE DRAWINGS

The foregoing and other aspects of the present invention will become apparent to those skilled in the art to which the present invention relates upon reading the following description with reference to the accompanying drawings.

DETAILED DESCRIPTION

Figure 1:
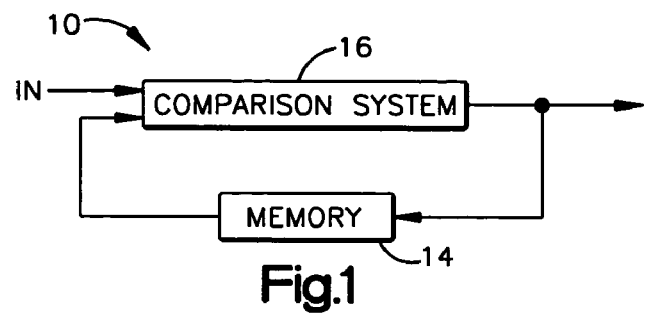
FIG. 1 illustrates a block diagram of a system in accordance with an aspect of the present invention.

The present invention relates to a system and method for successive approximation. Referring to FIG. 1, there is illustrated a successive approximation system 10 in accordance with an aspect of the present invention. The system 10 comprises a memory 14 having a successive approximation value. The system 10 also includes a comparison system 16 configured to receive and amplify the difference between a test signal (IN) and a signal corresponding to the successive approximation value stored in memory 14. Comparison system 16 can further comprise a multi-bit analog to digital converter (ADC) (not shown) for converting the amplified signal to a corresponding digital signal.

Logic (not shown) can be associated with memory 14 to adjust the successive approximation value based on the digital signal produced by comparison system 16. The logic can be implemented in hardware, software, or a combination of hardware and software. The logic can be responsive to adjust the successive approximation value based on the digital signal received from comparison system 16 until the digital signal is within a range of the multi-bit analog to digital converter.

The ADC of comparison system 16 has an input range. When the difference between the successive approximation value and the test signal (IN) is sufficiently large (e.g., out of the ADC input range), the ADC saturates. Logic in memory 14 can perform one bit at-a-time iterations starting with the most significant bits of the successive approximation value first, followed by the least significant bits, until the difference between the successive approximation value and the test signal (IN) is within the range of the ADC. The logic can also append the value of the digital signal to the least significant bits of the successive approximation value after the amplified signal is within the input range of the multi-bit analog to digital converter.

By appending the value of the digital signal to the successive approximation value, the resolution of the approximation value can be increased accordingly. The logic can also calibrate or convert the digital signal so that it corresponds to the successive approximation value. For example, if the ADC resolution is on a different scale than the LSB of the successive approximation value, the logic can convert the ADC value so that it corresponds to the LSB of the successive approximation value. The logic can be implemented in hardware, software, or a combination of software and hardware.

Figure 2:
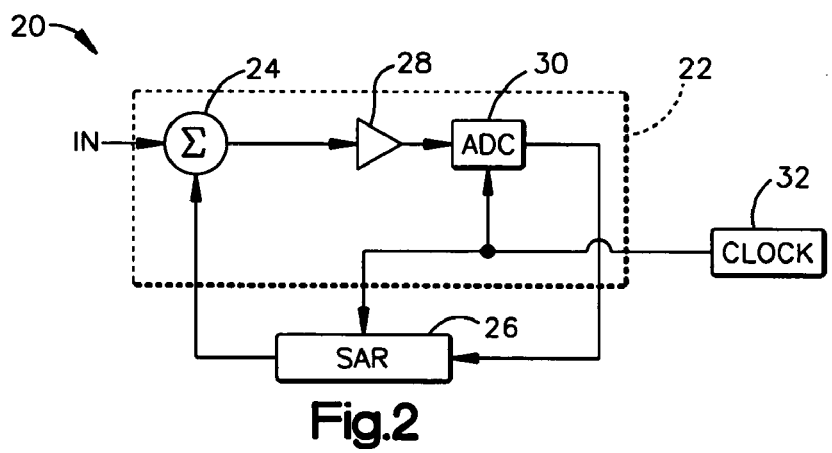
FIG. 2 is a block diagram of a system illustrating a comparison system in accordance with an aspect of the present invention.

FIG. 2 is a block diagram of a successive approximation system 20 illustrating an exemplary comparison system 22 in accordance with an aspect of the present invention. Summer 24 receives a test signal (IN) and a successive approximation value from successive approximation register (SAR) 26. The difference between the test signal and the analog signal is then amplified by amplifier 28. Amplifying the difference signal can increase the resolution of ADC. The ADC 30 converts the amplified difference signal from analog to digital. Clock 32 strobes ADC 30, controlling when ADC 30 samples the amplified difference signal, and controlling when SAR 26 computes the next iteration. SAR 26 can have a memory for storing the successive approximation value and a DAC (not shown) for converting the successive approximation value to a corresponding analog signal.

In operation, ADC 30 has an input range. When the difference between the successive approximation value and the test signal is sufficiently large, the amplified difference signal received by ADC 30 can be out of the ADC's range. This causes the ADC 30 to saturate. While ADC 30 is saturated, the logic in SAR 26 performs one bit at a time iterations, starting at the MSB and working towards the LSB, until the amplified difference signal is within the range of ADC 30. Once the amplified difference signal is within the range of ADC 30 (e.g., ADC 30 is no longer saturated), logic can be employed by SAR 26 to adjust the successive approximation value based on the digital signal produced by ADC 30. The SAR logic can be operative to directly append the digital signal to the successive approximation value, or it can be operative to calibrate the digital signal (e.g., to implement scaling to a desired word length) in accordance with the successive approximation value, increasing the resolution of the successive approximation value.

One aspect of system 20 is that the resolution of the successive approximation value can be increased without requiring additional iterations. Alternatively, system 20 enables the same resolution of an N bit SAR (where N is an integer greater than 0) to be obtained in fewer iterations than compared to prior approaches. For example, where M and N are integers greater than zero, by employing a M bit ADC, the resolution of an N bit SAR can be obtained in N–M iterations. The system 20 can also enable faster results to be obtained by eliminating unnecessary iterations. For example, once the amplified difference signal is within range of the ADC 30, the successive approximation process can be stopped. Alternatively, additional successive approximations can be performed to improve the accuracy of the digital signal.

Figure 3:
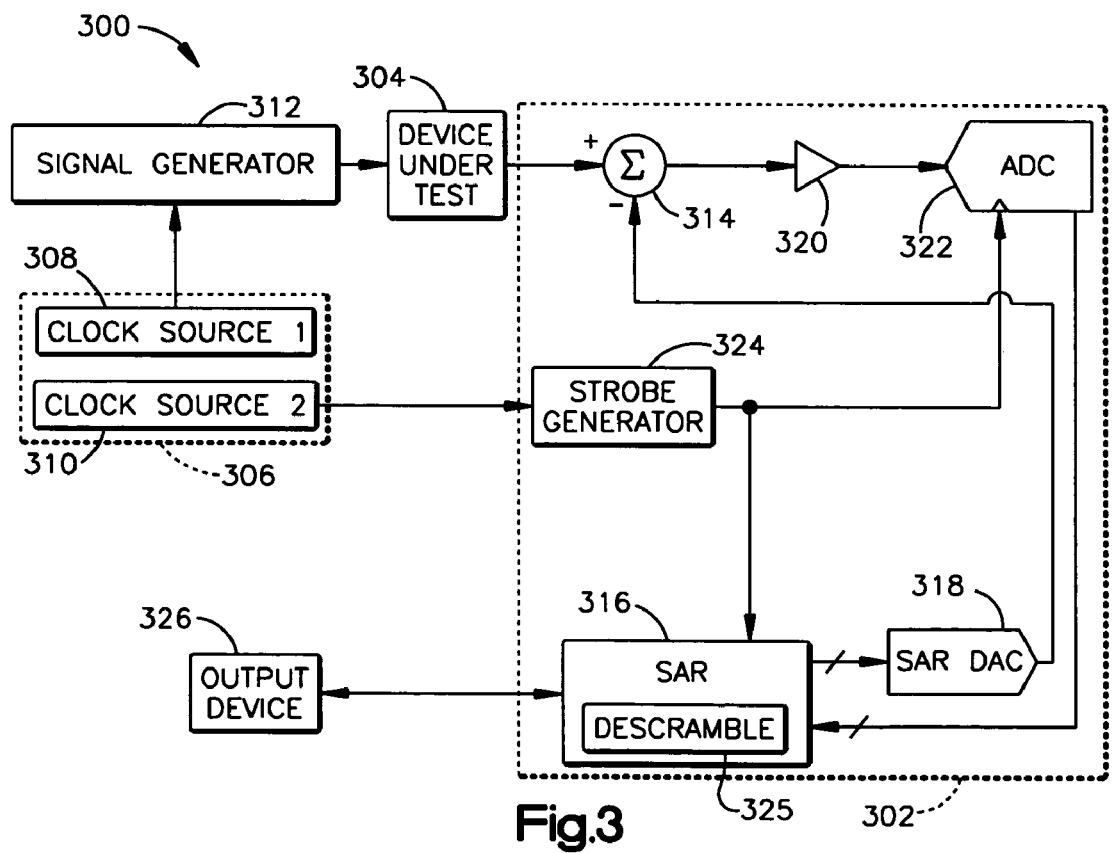
FIG. 3 illustrates a coherent undersampling digitizer in accordance with an aspect of the present invention.

Referring to FIG. 3, there is illustrated a system 300 in accordance to an aspect of the present invention. A coherent undersampling digitizer (CUD) 302 receives an input from a device under test 304. A clock source 306 provides clocking signals for the system 300. In the example of FIG. 3, clock source 306 comprises two clock sources 308, 310. The first clock source 308 provides clocking signals to a signal generator 312. The second clock source 310 provides clocking signals to CUD 302 based on the clocking signals from the first clock source 308.

Signal generator 312 provides a test waveform to device under test (DUT) 304. Device under test 304 outputs a test signal to one input of summer 314. Successive approximation register (SAR) 316 produces a digital approximation value. A SAR digital to analog converter (SAR DAC) 318 converts the approximation value to a corresponding analog signal. SAR DAC 318 provides the analog signal to a second input of summer 314. Summer 314 produces an error signal indicative of the difference between the test signal and the analog signal representing the analog approximation value. The error signal is amplified by amplifier 320.

The amplified error signal is converted to a corresponding digital signal by analog to digital converter (ADC) 322 which is clocked by strobe generator 324. ADC 322 can be a single bit or a multi-bit ADC. Strobe generator 324 receives a signal from second clock source 310. Strobe generator 324 can be implemented as a frequency divider that divides the signal received from the second clock source 310 by a predetermined factor, and accordingly provides strobe pulses to ADC 322 and SAR 316. Strobe generator 324 generates strobe pulses for a plurality of sampling points on the test signal.

SAR 316 comprises logic for adjusting the value approximation value based on the digital signal received from ADC 322 and memory for storing the successive approximation value. When the signal from SAR DAC 318 exceeds the test signal by a sufficient amount, the gain of amplifier 320 will amplify a difference signal to a level, which can cause ADC 322 to saturate. The SAR 316 includes logic that adjusts the SAR value based on the signal from ADC 322. Once DAC voltage is adjusted to approximate the test input voltage, the amplified error voltage will be within the range of ADC 322. This architecture thus functions as a SAR converter for the first X iterations (where X is an integer greater than zero and less than or equal to the number of bits of the SAR), and then as a sub-ranging or semi-flash ADC after the first X iterations. The captured full precision ADC value from ADC 322 can then be used by SAR 316 to correct the X bit value found during the SAR process. The logic included in SAR 316 can use the captured ADC value directly, or the value can be processed using further iterations, and/or the value can be calibrated (e.g., scaled) prior to combining with the value found during the successive approximation process.

The example system 300 of FIG. 3 uses two clock sources 308, 310. The first clock source 308 provides the stimulus for device under test 304, while a divided down version of the second clock source 310 is used to strobe ADC 322 and SAR 316 for making the successive approximation decisions by strobe generator 324. Sharing a common frequency reference by the two clock sources 308, 310 mitigates systematic frequency offset and frequency drift.

If the clock sources 308, 310 are programmed with a slight frequency offset between each other, a beat frequency is created. This can cause each rising edge of the second clock source 310 to occur in a slightly later point in the period of the input stimulus caused by the first clock source 308. This technique results in a plurality of sampling points obtained from the test signal by performing the iterations over a plurality of the wave's cycles, even when sampling occurs at less than the Nyquist rate. The frequency ratio between clock sources 308 and 310 can be selected to minimize collection time, which results in a scrambled sample order.

SAR 316 can employ a descrambling system 325 and/or a software routine to reorder the samples. As an example, the descrambling circuit 325 can include a memory having a plurality of memory cells coupled to a multiplexer. Multiplexer has a select line for selecting the appropriate memory cell to output. Additional hardware or software (not shown) can be employed to control selection of the appropriate memory cells so that the contents of memory are output in the correct order. Those skilled in the art will understand and appreciate various other approaches that can be utilized to provide the descrambling system 325.

By way of further example, the strobe generated by strobe generator 324 slips to the next sampling point on each rising edge, so a modified SAR approach can be used for obtaining values at the sampling points. Instead of iterating on the same sampling point N times, the conversion can be performed in a shuffled order. The first S strobes will determine the most significant bits of each sampling point, e.g. MSB[0] through MSB[S−1]. The next S strobes will determine the next most significant bit of each sampling point, e.g., MSB-1[0] through MSB-1[S−1], which continues until the least significant bit for each sampling point, e.g., LSB[0] through LSB[S−1], are determined. Using this algorithm, all of the sample points can be computed simultaneously and SAR 316 uses a S×N memory to store the results. Alternatively, the SAR 316 can determine each sample point individually by ignoring strobes for sample points between the sample point being determined, e.g., determine MSB[0], skip S−1 strobes, determine MSB-1 [0], skip S−1 strobes . . . until LSB[0] is determined, and repeat for each sample point.

After performing the iterations, SAR 316 employs additional logic for adjusting the approximated value obtained by iteration with the value of ADC 322. The digital value from ADC 322 can be directly combined (e.g., appended) to the successive approximation value, or the value can be processed using further iterations, and/or the value can be calibrated prior to combining with the successive approximation value found during the successive approximation process. The sampling point values or the digitized waveform can be sent to an output device 326.

Output device 326 can be a system for automated test equipment such as a computer or a Digital Signal Processor (DSP). Output device 326 can also include a monitor or printer for displaying the output, or include a storage device for storing the output. Output device 326 can utilize the values obtained at the sampling points to generate a digitized waveform corresponding to the test signal.

The amplifier gain, number of SAR cycles, and the ADC resolution are all variables that can be optimized. For example, the amplifier gain can be set high which can allow a lower resolution ADC to be used. Another strategy may use a modest amount of gain to add 2–3 bits of resolution to an already high performance ADC.

Figure 4:
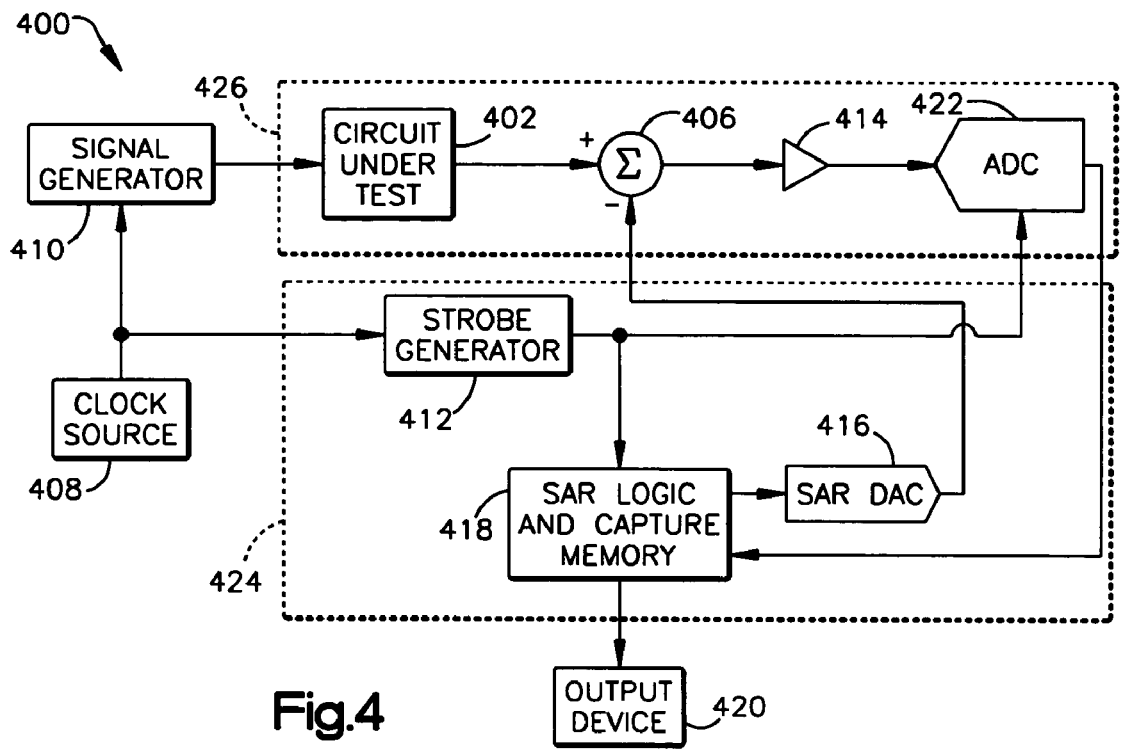
FIG. 4 illustrates a coherent undersampling digitizer in accordance with an aspect of the present invention.

FIG. 4 illustrates a coherent undersampling digitizer 400 employing a single clock source 408 in accordance with an aspect of the present invention. Digitizer 400 includes a clock source 408, a high frequency signal generator 410 to output a periodic waveform. An output device 420, such as an Automated Test Equipment (ATE) computer, and DSP processor, processes the results. A device under test 402, which is to be tested, receives the high frequency signal from signal generator 410. An integrated comparison system 426 (e.g., implemented as a card or other integrated module) includes the circuit under test 402, summer 406, amplifier 414 and ADC 422. A high speed digitizer control circuit 424 includes SAR logic and capture memory 418, strobe generator 412 and SAR DAC 416. The circuit 424 is connected to integrated comparison system 426 to provide strobe signals and a signal indicative of the successive approximation value. ADC 422 also provides SAR logic and capture memory 418 a digital version of the amplified difference signal determined by the comparison system 426.

By way of example, clock source 408 provides clocking signals to signal generator 410, which provides a repetitive test signal to the circuit under test 402. Circuit under test 402 outputs a test signal to one input of summer 406. The other input of summer 406 is connected to SAR DAC 416 which provides an analog signal corresponding to the successive approximation value from SAR Logic and Capture Memory 418.

Summer 406 provides a signal indicative of the difference between the signal received from circuit under test 402 and SAR DAC 416. The signal from summer 406 is then amplified by amplifier 414 and provided to ADC 422. ADC 422 provides a digital signal to SAR Logic and Capture memory indicative of the amplified difference between the output of the circuit under test 402 and the signal from SAR DAC 416. SAR Logic and capture memory 418 receives the digital signal from ADC 422 and adjusts the successive approximation value based on the digital signal.

In operation, clock source 408 outputs first clock pulses to the high frequency signal generator 410. The signal generator 410 outputs a repetitive waveform, which may be at a high frequency or in the alternative a repetitive digital pattern, to the circuit under test 402. For example, the signal generator may provide a high frequency waveform in accordance with the output clock pulses. The circuit under test 402 outputs a repeating test signal to summer 406.

Clock source 408 determines the repetition frequency of the repetitive waveform being input to the circuit under test 402. The strobe generator 412, which inputs the clock pulses output from the clock source 408, controls the sampling intervals of the ADC 422 to sample the output of the circuit under test 402. ADC 422, in turn, digitizes a predetermined point of time on the repeating test signal at the output of the circuit under test 402. The sampling times define a strobe interval of ADC 422, which sampling times can be set to coincide with a fixed point in the repeating waveform. For example, the sampling times may be separated by a time interval. At each strobe interval, the ADC 422 outputs a digital signal indicative of the amplified difference between the instantaneous voltage level of the repeating test signal and the output of the SAR DAC 416. SAR logic and capture memory 418 then outputs a signal sufficient to result in the successive approximation voltage at the output of the analog integrator or SAR DAC 416 to either increase or decrease, depending on the strobed output from ADC 422.

For example, if the output of ADC 422 is saturated high or a value indicating the value of the repeating test signal is higher than the voltage output by SAR DAC 416 (a logic "1"), then the output of the SAR DAC 416 may be increased by adjusting the successive approximation value. Similarly, if the output is saturated low or a value indicating the value of the repeating test signal is lower than the voltage output by SAR DAC 416 (a logic "0"), then the output of SAR DAC 416 may be decreased by adjusting the successive approximation value. The successive approximation process of the SAR DAC 416 may be a binary voltage search, whereby the output of the SAR DAC 416 is successively adjusted in binarily weighted voltage steps of decreasing magnitude. Alternatively, the one or more integrators (not shown) may be used to output an integrated signal instead of the SAR DAC 416 to integrate up or down to effect each iteration of successive approximation. After the successive approximation process has been repeated a sufficient number of iterations, the voltage at the output of the SAR DAC 416 should be approximately equal to the repeating test signal's instantaneous voltage at the strobed sample time.

After the successive approximation routine has completed, ADC 422 provides a residue value. The residue value provided by ADC 422 can be used to increase the resolution of the successive approximation value. For example, the residue value can be directly appended to the successive approximation value, or it can be calibrated (e.g., scaled) before combining with the successive approximation value, or the successive approximation value can be calibrated (e.g., scaled) according to the residue value.

Since each sample may be digitized at a rate less than twice the highest frequency component in the repeating test signal (i.e., less than the Nyquist rate), the sampling process of the invention may be utilized with an apparatus employing an undersampling digitization process.

As illustrated in FIG. 4, the comparison circuit comprising summer 406, amplifier 414 and ADC 422 are on the same integrated system 426 as circuit under test 402. Those skilled in the art will appreciate that, the pulse generating circuit 412, SAR logic and capture memory 418, clock circuit 408, and signal generating circuit 410 can also be placed on the same integrated circuit as the circuit under test 402.

Figure 5:
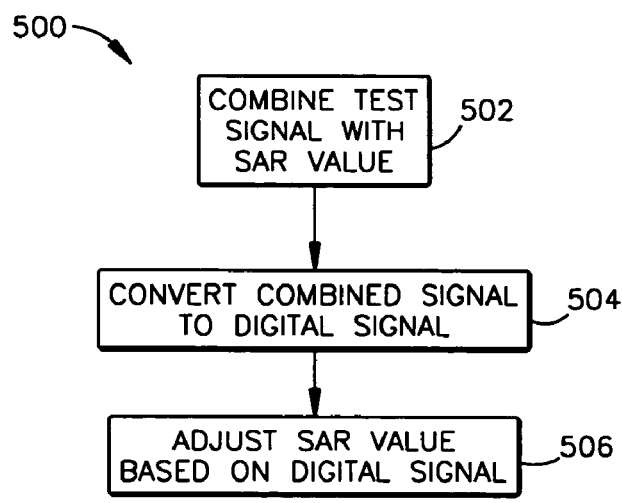
FIG. 5 illustrates a method in accordance with an aspect of the present invention.
Figure 6:
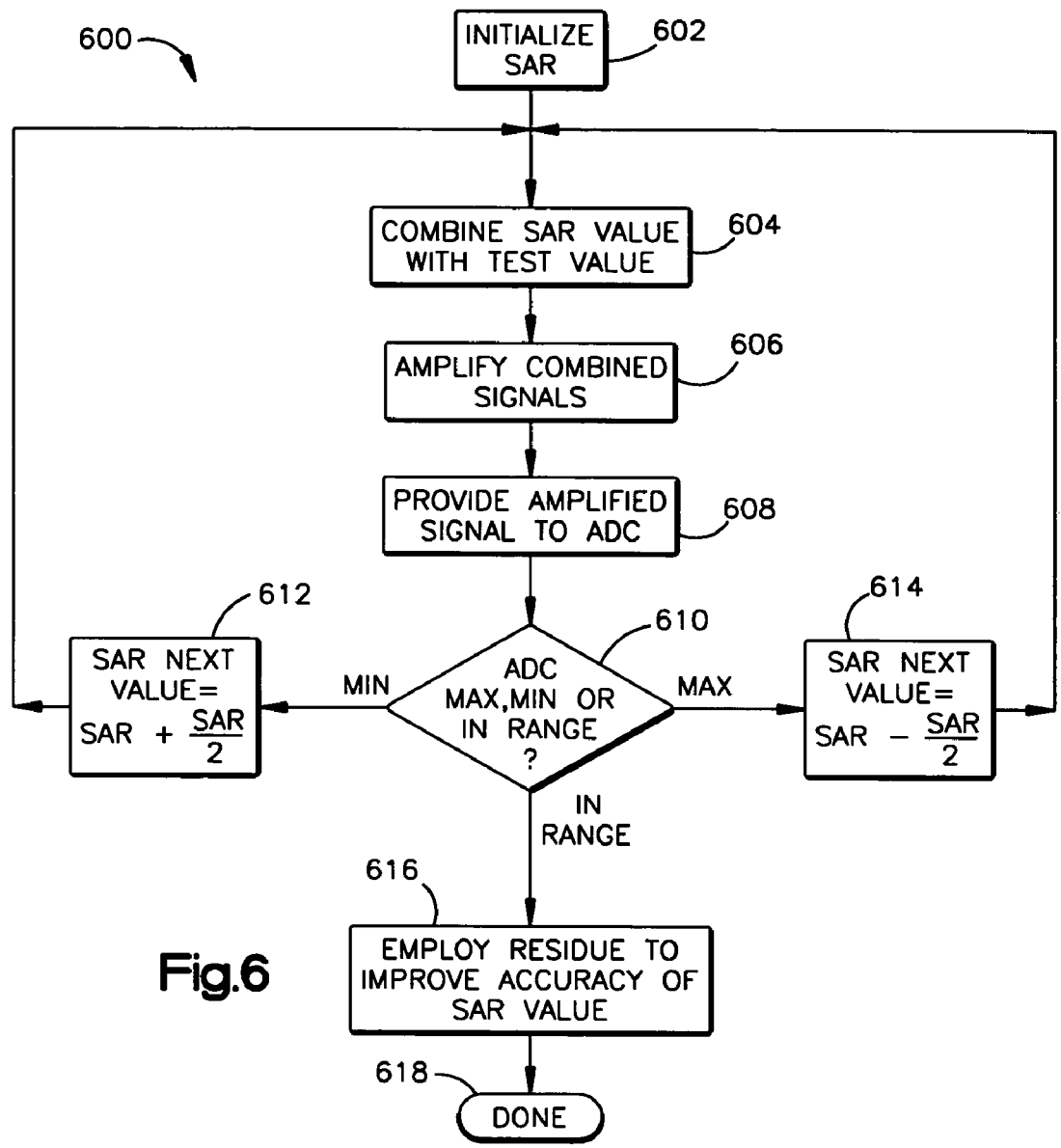
FIG. 6 illustrates a method employing successive approximation techniques in accordance with an aspect of the present invention.

In view of the examples shown and described above, a methodology for successive approximation in accordance with the present invention will be better appreciated with reference to FIGS. 5–6. While, for purposes of simplicity of explanation, a methodology is shown and described as executing serially, it is to be understood and appreciated that the methodology is not limited by the order shown, as some aspects may, in accordance with the present invention, occur in different orders and/or concurrently from that shown and described herein. Moreover, not all features shown or described may be needed to implement a methodology in accordance with the present invention. Additionally, such methodology can be implemented in hardware (e.g., one or more integrated circuits), software (e.g., running on a DSP or ASIC) or a combination of hardware and software.

FIG. 5 illustrates a method 500 for successive approximation in accordance with an aspect of the present invention. At 502, a test signal (or a signal to be approximated) is combined with a successive approximation signal (SAR value). The SAR value can be an analog signal indicative of a digital value stored in a successive approximation register. The signals can be combined to indicate the difference between the signals. At 504, the combined signal is converted to a multi-bit digital signal. At 506, the SAR value is adjusted based on the digital signal. If it is determined that the SAR value is higher than the test signal, then the SAR value can be adjusted downward. Similarly, if the SAR value is lower than the test signal, then the SAR value can be adjusted upward.

After the SAR value has been adjusted, the adjusted SAR value can again be combined with the test signal. The combined signal can then be converted to a digital signal and the SAR value accordingly adjusted. The method 500 can be repeated to obtain a desired resolution. The SAR value can be adjusted one bit at a time. The process can be repeated until the digital signal is within a predetermined range (e.g., within an operating range of circuitry that is performing the converting at 504). When the digital signal is within a predetermined range, it can be used to increase the resolution of the SAR value. The digital signal can be calibrated before combining with the SAR value.

The combined signal produced by 502 can be indicative of the difference between the SAR value and the test signal. To increase resolution of the digital signal, the combined signal can be amplified by a desired gain factor.

FIG. 6 illustrates a method 600 employing successive approximation techniques in accordance with an aspect of the present invention. The method can be employed to achieve a desired resolution for the value being approximated. At 602, a successive approximation register is initialized with an initial value. At 604, the value in the successive approximation register (SAR value) is combined with a test value. The SAR value and test value can be combined to produce a difference between the values. The difference can indicate which value has the largest magnitude. At 606, the combined values are amplified. At 608, the amplified signal is provided to an ADC for converting. At 610, the ADC determines whether the amplified signal is within a range associated with the ADC.

If at 610, the SAR value is outside the range of the ADC (e.g., the ADC is saturated) and below the test value (MIN), then at 612, the next SAR value is set to be equal to the current SAR value plus the current SAR VALUE divided by 2. The method 600 then returns to 604 where the next SAR value is combined with the test value.

If at 610, the SAR value is outside the range of the ADC and above the test value (MAX), then at 612, the next SAR value is set to be equal to the current SAR value minus the current SAR VALUE divided by 2. This MAX condition generally corresponds to a saturation condition of the ADC. The method 600 then returns to 604 where the next SAR value is compared with the test value.

If the amplified signal is within the ADC's range, then the SAR value is near the test value and the method proceeds to 616. If at 610, the SAR value is within the range of the ADC, the ADC then contains a residue value. At 616, the residue is employed to improve or otherwise ensure accuracy of the SAR value. For instance, the residue value can be calibrated (e.g., scaled) and added to the SAR value. If the ADC is already calibrated to the SAR value, then at 616 the residue value can be combined directly to the SAR value. Calibration can be performed by lookup tables, interpolation, experimental determination, or any other suitable technique. After employing the residue with the SAR value the method ends at 618.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A successive approximation undersampling ADC system comprising:
   a memory having a successive approximation value;
   a summer coupled to a test signal and an output of the memory to generate a difference signal being a difference therebetween;
   an amplifier coupled to an output of the summer to generate an amplified signal from the difference signal;
   a single multi-bit analog to digital converter coupled to an output of the amplifier to convert the amplified signal to a digital signal wherein the analog to digital converter operates as a comparator until the amplified signal is within range of the analog to digital converter.

2. The successive approximation ADC system of claim 1, further comprising logic operative to adjust the successive approximation value based on the digital signal.

3. The successive approximation ADC system of claim 2, wherein the multi-bit analog to digital converter has a range, the logic being responsive to adjust the successive approximation value based on the digital signal to place the digital signal within the range of the multi-bit analog to digital converter.

4. The successive approximation ADC system of claim 3, wherein the logic appends the digital signal to the successive approximation value to increase the resolution of the successive approximation value after the digital signal is within the range of the multi-bit analog to digital converter.

5. The successive approximation ADC system of claim 3, wherein the logic calibrates the digital signal in accordance with the successive approximation value after the digital signal is within the range of the multi-bit analog to digital converter.

6. The successive approximation ADC system of claim 3, the logic being operative to adjust the successive approximation value based on the digital signal by performing a single bit iteration when the amplified signal is outside the range of the multi-bit analog to digital converter, starting with most significant bit first to least significant bit, until the amplified signal is within the range of the multi-bit analog to digital converter.

7. The successive approximation ADC system of claim 6, the logic being operative to append a value of the digital signal to the least significant bits of the successive approximation value after the amplified signal is within range of the multi-bit analog to digital converter.

8. The successive approximation ADC system of claim 7, the logic calibrating the digital signal according to the successive approximation value.

9. The successive approximation ADC system of claim 6, wherein at least one of the pulse generating circuit, memory, clock circuit, and signal generating circuit are implemented on the same integrated circuit as the circuit under test and the comparison system.

10. The successive approximation ADC system of claim 3, further comprising
    a clock source to produce clock signals;
    a signal generating circuit to generate and output a repetitive test waveform to a device under test in accordance with the clock signals, the device under test outputting the test signal; and
    a pulse generating circuit coupled to the clock circuit for producing sampling point signals corresponding to sampling points spaced across the test signal based on the clock signals;
    the multi-bit analog to digital converter being operative to convert the amplified signal to the digital signal based on the sampling point signals resulting in a digitized waveform corresponding to the test signal.

11. The successive approximation ADC system of claim 10, further comprising a second clock source producing a second clock signal, the pulse generating circuit being operative to determine a frequency ratio between the clock source and the second clock source and to employ the frequency ratio for producing the sampling point signals.

12. The successive approximation ADC system of claim 11, wherein the frequency ratio is selected to minimize time, resulting in a scrambled sample order, the successive approximation system further comprising a descrambling system to reorder the samples before outputting the digitized waveform.

13. The successive approximation ADC system of claim 10, wherein the sampling point signals sample the test signal at a sample rate less than the Nyquist rate of the test signal.

14. A coherent undersampling digitizer, comprising:
means for receiving a repetitive test signal from a device under test in accordance with first clock signals;
means for producing a difference signal based on the difference between the repetitive test signal and a successive approximation signal;
means for amplifying the difference signal; and
means for converting the amplified difference signal to a multi-bit digital comparison signal wherein the converting means operates as a comparator until the amplified difference signal is within range of the converting means.

15. The coherent undersampling digitizer of claim 14, the means for converting producing a first signal when the amplified difference signal is outside a range of the means for converting, and producing a second signal indicative of magnitude of the amplified difference signal when the amplified difference signal is within the range of the means for converting.

16. The coherent undersampling digitizer of claim 14, the means for producing sampling point signals being responsive to a ratio between the first clock signals and second clock signals and to generate the successive approximation signal based on the multi-bit digital comparison signal.

17. The coherent undersampling digitizer of claim 15, the means for producing sampling point signals generating single bit iterations of the successive approximation signal while the first signal is produced and a multi-bit iteration of the successive approximation signal when the second signal is produced.

18. A method for successive approximation undersampling analog to digital conversion, comprising:
combining a test signal with a successive approximation signal;
amplifying the combined signal to generate an amplified combined signal;
converting the amplified combined signal to a multi-bit digital comparison signal using a multibit analog to digital converter that operates as a comparator until the amplified combined signal is within range of the analog to digital converter; and
adjusting the successive approximation signal based on the digital comparison signal.

19. The method for successive approximation analog to digital conversion of claim 18, further comprising increasing the successive approximation value by one bit when the digital comparison signal is at a maximum value.

20. The method for successive approximation analog to digital conversion of claim 18, further comprising decreasing the successive approximation value by one bit when the digital comparison signal is at a minimum value.

21. The method for successive approximation analog to digital conversion of claim 18, further comprising combining the successive approximation signal with the digital comparison signal when the digital comparison signal is within a predetermined range of circuitry that performs the converting.

22. The method for successive approximation analog to digital conversion of claim 21, further comprising calibrating the digital comparison signal to a scale corresponding to a scale of the successive approximation signal.

* * * * *